United States Patent [19]

Hashimoto

[11] Patent Number: 4,974,207

[45] Date of Patent: Nov. 27, 1990

[54] SEMICONDUCTOR MEMORY DEVICE

[75] Inventor: Kiyokazu Hashimoto, Tokyo, Japan

[73] Assignee: NEC Corporation, Tokyo, Japan

[21] Appl. No.: 317,252

[22] Filed: Feb. 28, 1989

[30] Foreign Application Priority Data

Feb. 29, 1988 [JP] Japan .................................. 63-48313

[51] Int. Cl.$^5$ ............................................. G11C 11/34
[52] U.S. Cl. ....................................... 365/210; 365/207
[58] Field of Search ............ 365/207, 208, 210, 189.09

[56] References Cited

U.S. PATENT DOCUMENTS 4,799,195  1/1989  Iwahashi et al. ............... 365/210 X
4,802,138  1/1989  Shimamune .......................... 365/210

FOREIGN PATENT DOCUMENTS 58-208990  12/1983  Japan .................................. 365/210

Primary Examiner—Joseph A. Popek
Attorney, Agent, or Firm—Sughrue, Mion, Zinn, Macpeak & Seas

[57] ABSTRACT

In a semiconductor memory device, an output of a sense amplifier circuit and a reference voltage of a reference voltage producing circuit are compared to decide whether a content of a selected memory cell is "1" or "0". A load characteristic of a load circuit of the reference voltage producing circuit is different from that of the sense amplifier circuit, so that current flowing through a reference field effect transistor can be increased to a level of current flowing through a memory cell in which "0" is stored. Therefore, a time in which an output voltage of the reference voltage producing circuit is lowered from a voltage set at the stand-by mode to the reference voltage set at the reading mode is shortened at the reading mode subsequent to the stand-by mode.

3 Claims, 7 Drawing Sheets

SEMICONDUCTOR MEMORY DEVICE

FIELD OF THE INVENTION

The invention relates to a semiconductor memory device, and more particularly to an electrically programmable and erasable semiconductor device (simply defined "EE-PROM" hereinafter) which is mainly composed of insulated gate field effect transistors (simply defined "IG FETs" hereinafter).

BACKGROUND OF THE INVENTION

One type of a conventional EE-PROM mainly comprises memory cells arranged in a matrix pattern, a sense amplifier circuit for producing a signal dependent on the content of a memory cell selected from the matrix memory cells, a reference voltage producing circuit for producing a reference signal, and a differential amplifier for comparing the signal dependent on the content of the selected memory cell and the reference signal and amplifying a compared difference between the signals.

In operation of the reading mode, a reading voltage is applied to a gate electrode of a transistor for the selected memory cell. Then, the transistor is turned on where the memory cell has been programmed, while the transistor is turned off where the memory cell has been erased. As a result, a voltage $V_{ON}$ which is lower than the reference signal is supplied from the sense amplifier circuit in the former state, while a voltage $V_{OFF}$ which is higher than the reference signal is supplied from the sense amplifier circuit in the latter state. Consequently, a signal "L" is supplied from the differential amplifier in the former state, while a signal "H" is supplied therefrom in the latter state. Accordingly, stored information can be read from the selected memory cell. The construction and operation of the conventional EE-PROM will be described in detail latter.

According to the conventional EE-PROM, however, there is a disadvantage that a speed of reading a content of a selected memory cell is not so fast as expected for the reason why the time in which a reference signal level is set to be a reference value is difficult to be shortened. The reasons thereof will be explained in more detail later.

SUMMARY OF THE INVENTION

Accordingly, it is an object of the invention to provide a semiconductor memory device in which a speed of reading a content of a memory cell selected from the matrix memory cells can be fast without inviting a complicated circuit structure.

According to the invention, a semiconductor memory device comprises, a sense amplifier circuit for detecting a content of a memory cell selected from plural memory cells and producing a memory cell signal of high or low level dependent on said content, a reference voltage producing circuit for producing a reference voltage, and means for comparing said memory cell signal and said reference voltage to decide whether said content is "1" or "0".

In the semiconductor memory device, a load characteristic of a load circuit of the reference voltage producing circuit is different from that of the sense amplifier circuit, so that a level of current flowing through a reference IGFET in the reference voltage producing circuit is set to the same extent as current flowing through a memory cell storing "0" therein. For this circuit structure, the time in which an output voltage of the reference voltage producing circuit is lowered from a voltage ($V_{CC}-V_{TP}$) set at the stand-by mode to a reference voltage $V_{REF}$ set at the reading mode is shortened at the reading mode subsequent to the stand-by mode as compared to that of the conventional semiconductor memory device. Therefore, an operation speed of the semiconductor memory device is determined by the intrinsic operation speed of the sense amplifier circuit independently of an operation speed of the reference voltage producing circuit.

BRIEF DESCRIPTION OF DRAWINGS

The invention will be explained in more detail in conjunction with appended drawings wherein.

DESCRIPTION OF PREFERRED EMBODIMENTS

Before explaining a semiconductor memory device in an embodiment according to the invention, the aforementioned conventional semiconductor memory which is an electrically erasable PROM (EE-PROM) will be explained in conjunction with FIGS. 1 to 3.

Figure 1:
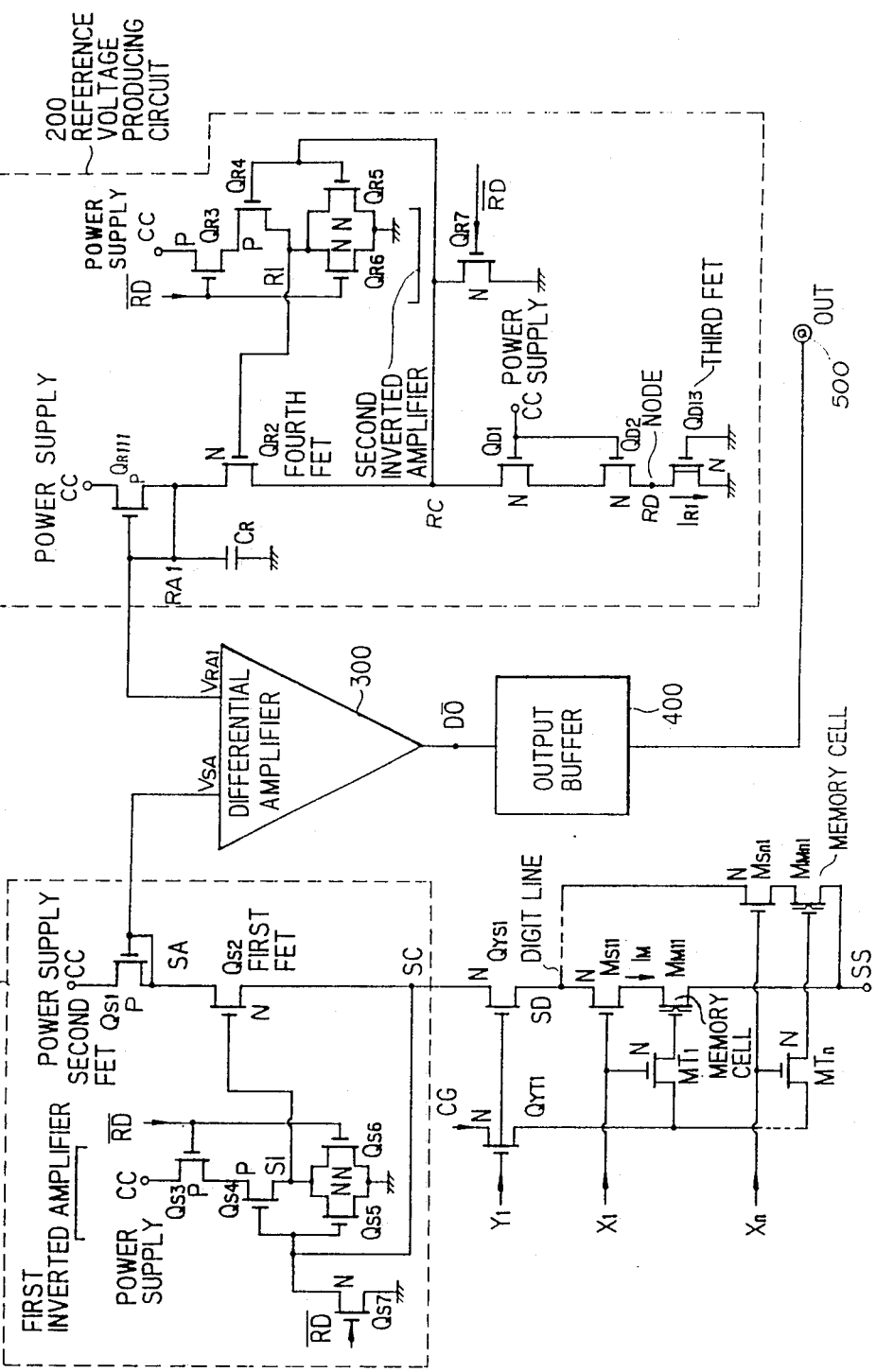
FIG. 1 is a circuit diagram showing a conventional semiconductor memory device.

In FIG. 1, a part of the EE-PROM which operates in the reading mode is shown, while circuits for controlling the writing mode and the erasing mode are not shown. In the EE-PROM, $Y_1$ denotes an output signal line of a Y decoder circuit provided in a chip (not shown), $X_1 \ldots X_n$ output signal lines of an X decoder circuit provided in the chip, CG a signal line for applying a reading voltage to read information from one of memory cells in the chip, and $\overline{RD}$ a control signal line which is controlled, such that the control signal line $\overline{RD}$ is "L" in the reading mode, and the control signal line $\overline{RD}$ is "H" in the stand-by mode.

Although memory cells are disposed in the column and row directions so as to form a matrix in an actual EE-PROM, only two memory cells $M_{M11}$ and $M_{Mn1}$ belonging to a row $Y_1$ are shown in FIG. 1. For simplification of the explanation, it is assumed that $Y_1$ is selected as being a Y address line for selecting a column direction, while $X_1$ is selected as being an X address line for selecting a row direction. When a memory cell has been programmed, the threshold value of this memory cell is negative and, when a reading voltage is applied to the gate, the memory cell turns conductive, which is defined as "0". On the other hand, when a memory cell has been erased, the threshold value of this memory cell is positive and, when a reading voltage is applied to the gate, the memory cell turns non-conductive, which is defined as "1". $M_{S11} \ldots M_{Sn1}$ denote N-channel enhancement type IGFETs (hereinafter referred to as "NE-IGFETs") for selecting the X addresses of memory cells, and the NE-IGFETs are connected in series to the respective memory cells. $Q_{YS1}$ is an NE-IGFET for selecting the Y address of a memory cell, while $Q_{YT1}$ is an NE-IGFET for selecting the Y address of a byte, and $M_{T1} \ldots M_{Tn}$ are NE-IGFETs for selecting the X addresses of bytes which are provided in one-to-one correspondence with the bytes. SS is connected to the source of the memory cells and is set at "0" in the reading mode. $I_M$ denotes current flowing through a memory cell stored with "0".

In a sense amplifier circuit 100, $Q_{S1}$, $Q_{S3}$ and $Q_{S4}$ are P-channel enhancement type IGFETs (hereinafter referred to as "PE-IGFETs"). $Q_{S2}$, $Q_{S5}$, $Q_{S6}$ and $Q_{S7}$ are NE-IGFETs. $Q_{S1}$ to $Q_{S6}$, $Q_{YS1}$ and $M_{S11}$ constitute in combination a load with respect to the memory cell $M_{M11}$. The voltage $V_{SA}$ of the output SA of the sense amplifier circuit 100, when a memory cell stored with "0" is selected, is based on a load characteristic determined by these IGFETs and the value of the current $I_M$ flowing through the memory cell. Further, $Q_{S2}$ is defined as a first FET, and $Q_{S1}$ a second FET, while a first inverted amplifier is provided as indicated therein.

In a reference voltage producing circuit 200 $Q_{R111}$, $Q_{R3}$ and $Q_{R4}$ are PE-IGFETs, while $Q_{R2}$, $Q_{R5}$, $Q_{R6}$, $Q_{R7}$, $Q_{D1}$ and $Q_2$ are NE-IGFETs, and $Q_{D13}$ an N-channel depletion type IGFET. $Q_{R111}$, $Q_{R2}$ to $Q_{R6}$, $Q_{D1}$ and $Q_{D2}$ constitute in combination a load with respect to the reference IGFET $Q_{D13}$. The voltage $V_{RA1}$ of the output $RA_1$ of the reference voltage producing circuit 200 is based on a load characteristic determined by these IGFETs and the value of the current $I_{R1}$ flowing through $Q_{D13}$. Further, $Q_{D3}$ is defined as a third FET, and $Q_{R2}$ a fourth FET, while a second inverted amplifier is provided as indicated therein.

In the reference voltage producing circuit 200 $Q_{R111}$, $Q_{R2}$, $Q_{R3}$, $Q_{R4}$, $QR_5$, $Q_{D1}$ and $Q_{D2}$ are designed, such that the gate length and gate width of these transistors are the same as those of the IGFETs $Q_{S1}$, $Q_{S2}$, $Q_{S3}$, $Q_{S4}$, $Q_{S5}$, $Q_{S6}$, $Q_{YS1}$ and $M_{S11}$ which determine in combination a load characteristic of the sense amplifier circuit 100. Therefore, the load characteristic of the reference voltage producing circuit 200 are the same as that of the sense amplifier circuit 100.

Further, $C_R$ collectively denotes a capacitance (including an aluminum wiring capacitance, input capacitances of comparators other than a differential amplifier to be explained, etc.) which is loaded on the output $RA_1$ of the reference voltage producing circuit 200. 300 denotes a differential amplifier which makes a comparison between an output voltage $V_{SA}$ of the sense amplifier circuit 100 which changes in accordance with whether a selected memory cell is stored with "0" or "1" and a reference voltage $V_{RA1}$ of the reference voltage producing circuit 200 and amplifies the difference therebetween. When it is detected that "0" is stored in the selected memory cell, "H" is produced as the output $\overline{DO}$, while when it is detected that "1" is stored therein, "L" is produced as the output $\overline{DO}$.

Finally, 400 denotes an output buffer circuit which serves to transmit the output $\overline{DO}$ of the differential amplifier 300 to an external terminal 500.

Figure 2:
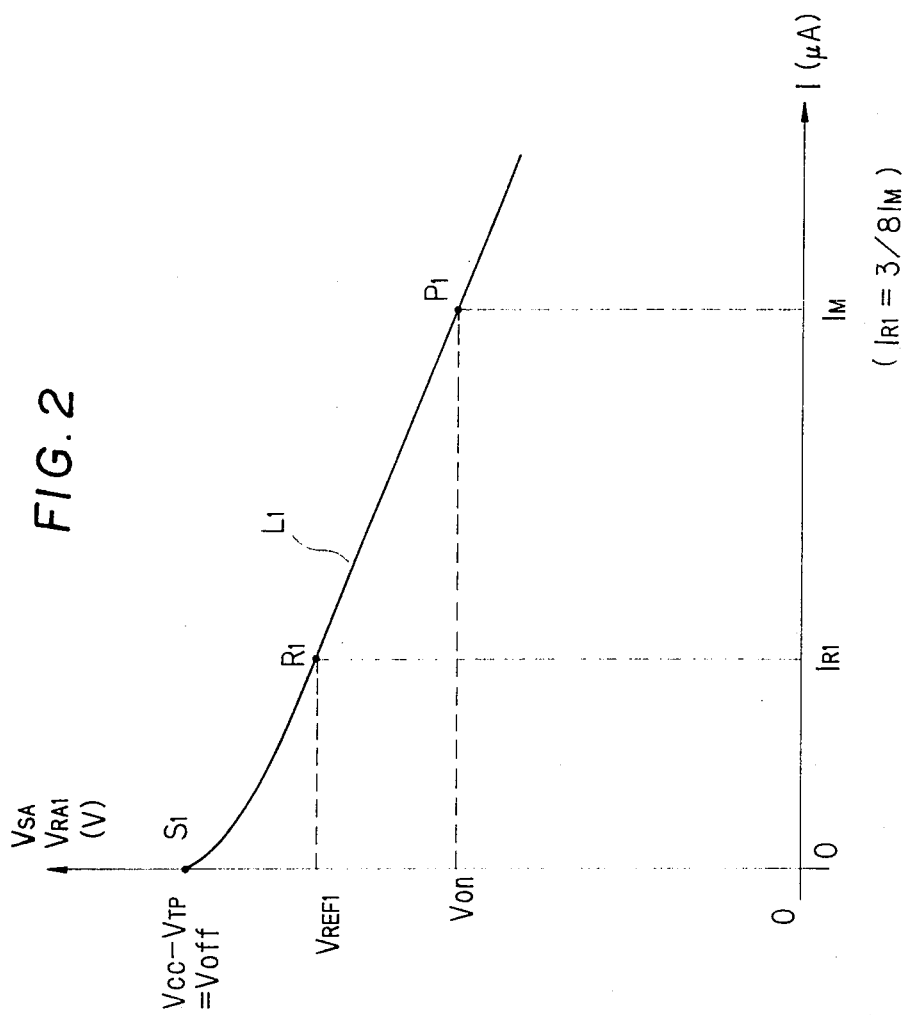
FIG. 2 is an explanatory diagram showing a load characteristic of a sense amplifier circuit and a reference voltage producing circuit in the conventional semiconductor memory device.
Figure 3:
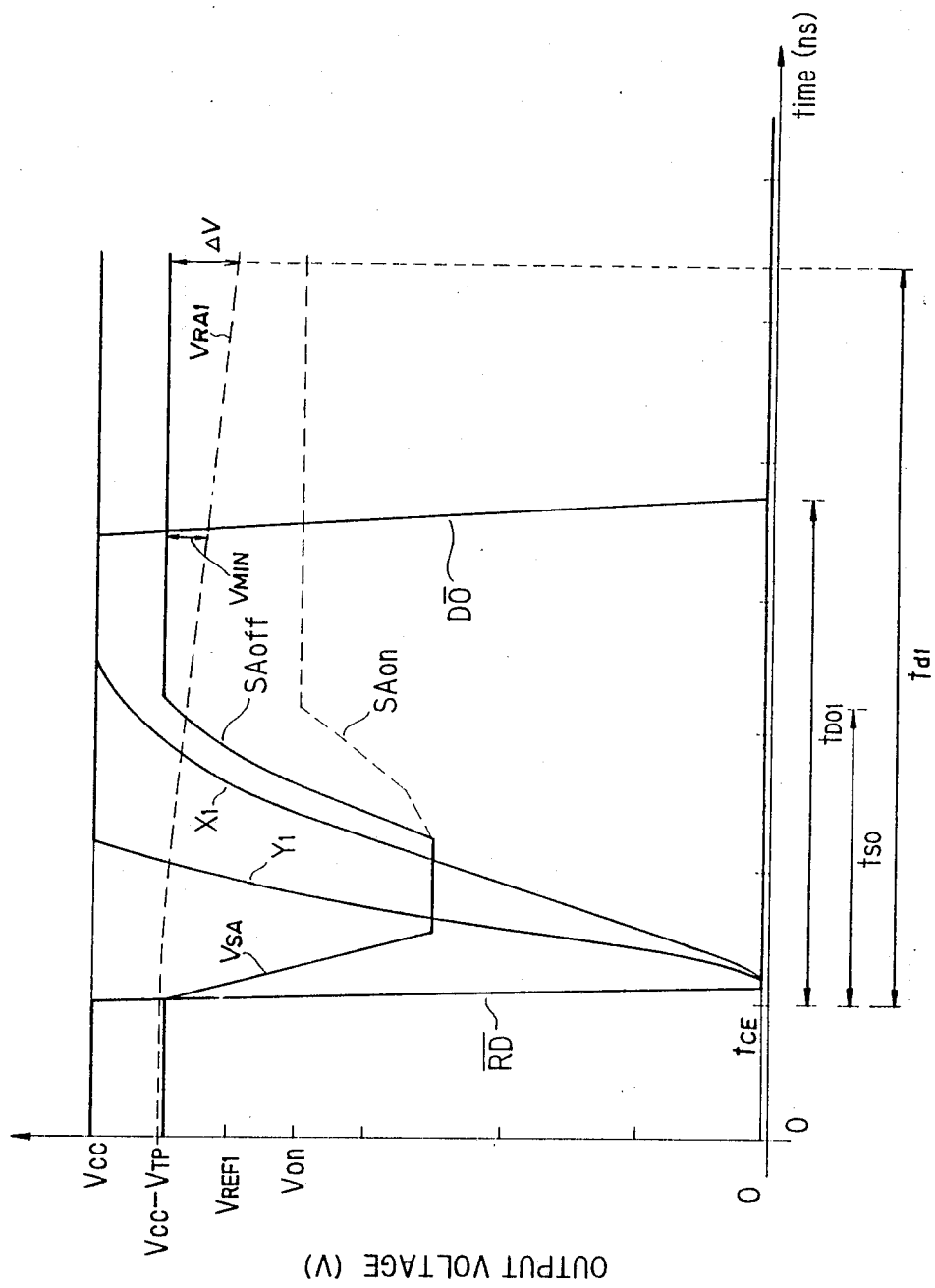
FIG. 3 is an explanatory diagram showing waveforms of signals in the conventional semiconductor memory device.

FIG. 2 shows the change in the voltage $V_{SA}$ of the output SA of the sense amplifier circuit 100 in accordance with the change of the current flowing through $M_{M11}$ in a case where $M_{M11}$ is stored with "0", and the change in the voltage $V_{RA1}$ of the output $RA_1$ of the reference voltage producing circuit 200 in accordance with the change of current flowing through the reference IGFET $Q_{D13}$. As described above, since the reference voltage producing circuit 200 is designed, such that the load characteristic of the load circuit are same as that of the load circuit in the sense amplifier circuit 100, the characteristics of the voltages $V_{SA}$ and $V_{RA1}$ are represented by the same curve L1 shown in FIG. 2.

In operation, a power supply voltage $V_{CC}$ is applied to $Q_{S1}$, $Q_{S3}$, $Q_{R111}$ and $Q_{R3}$, $\overline{RD}$ is set to be "0", and a reading voltage CG is applied to $Q_{YT1}$. Here, it is assumed that all the NE-IGFETs have the same threshold value $V_{TN}$ and all the PE-IGFETs have the same threshold value $V_{TP}$. When a memory cell stored with "0" is selected, current of the current value $I_M$ flows through this memory cell. In consequence, the voltages at the digit line SD and the node SC lower, while the voltage at the node SI rises, thereby causing $Q_{S2}$ called the first FET to turn conductive. Thus, the voltage at the node SA moves from $[V_{CC}-V_{TP}]$ along the load curve $L_1$ and reaches equilibrium at the point $P_1$ as shown in FIG. 2.

At this time, the same current as $I_M$ flows through $Q_{S2}$. The voltage $V_{SA}$ at the node SA is an output voltage of the sense amplifier circuit 100 when a memory cell stored with "0" is selected, and the value of this output voltage is hereinafter referred to as $V_{ON}$.

On the other hand, when a memory cell stored with "1" is selected, this memory cell turns non-conductive. In consequence, the voltages at the digit line SD and the node SC rise, while the voltage at the node SI lowers, thereby causing $Q_{S2}$ to turn non-conductive. Thus, the voltage $V_{SA}$ at the node SA reaches equilibrium at the point $S_1$. At this time, the voltage $V_{SA}$ at the node SA is $[V_{CC}-V_{TP}]$, and the value of this output voltage is hereinafter referred to as $V_{OFF}$. Thus, the reference voltage $V_{REF1}$ is set approximately a median between $V_{ON}$ and $V_{OFF}$, so that the differential amplifier 300 can accurately detect whether a selected memory cell is stored with "1" or "0". The load circuit of the sense amplifier circuit 100 and the load circuit of the reference voltage producing circuit 200 are designed, such that the value of $[V_{OFF}-V_{REF1}]$ and the value of $[V_{REF1}-V_{ON}]$ are not lower than a minimum voltage $V_{MIN}$ which can be detected by the differential amplifier 300.

In this point, the current $I_{R1}$ flowing through the reference IGFET $Q_{D13}$ is set to be $\frac{3}{4}I_M$, so that the reference voltage $V_{REF1}$ is set at a median between $V_{ON}$ and $V_{OFF}$ (the point $R_1$) as shown in FIG. 2.

The operation will be further explained with reference to FIG. 3. When the device is in the standby mode, $\overline{RD}$ is "H", and $Q_{S7}$, $Q_{R7}$, $Q_{S6}$ and $Q_{R6}$ are conductive, while $Q_{S3}$ and $Q_{R3}$ are non-conductive. In consequence, the nodes SC, RC, SI and RI are all "L", and both $Q_{S2}$ and $Q_{R2}$ are non-conductive, so that the output SA of the sense amplifier circuit 100 and the output $RA_1$ of the reference voltage producing circuit 200 are raised in accordance with the charge thereof to a voltage $[V_{CC}-V_{TP}]$. In addition, the output $\overline{DO}$ of the difference amplifier 300 is raised in accordance with the charge thereof to the voltage $V_{CC}$ (although not shown). When $\overline{RD}$ changes from "H" and "L" and the operation mode is changed from the stand-by mode to the reading mode, $Q_{S3}$ and $Q_{S4}$ turn conductive, so that the node SI changes from "L" to "H". Simultaneously, address signals $X_1$ and $Y_1$ become high. In consequence, $Q_{S2}$ turns conductive and the charge accumulated at the node SA is rapidly discharged. As a result, the voltage $V_{SA}$ at the node SA lowers linearly as shown in FIG. 3.

If it is assumed that a memory cell which is selected at this time has "1" stored therein, the nodes SC and SD are charged again. As a result, the voltage at the node SC rises, while the voltage at the node SI lowers. In consequence, $Q_{S2}$ turns non-conductive and equilibrium at $[V_{CC}-V_{TP}]$ (the curve $SA_{OFF}$).

If the selected memory cell has "0" stored therein, the nodes SA and SC which have been overdischarged are charged to the equilibrium voltage. As a result, the voltage $V_{SA}$ at the node SA reaches equilibrium at $V_{ON}$ (the curve $SA_{ON}$).

In the reference voltage producing circuit 200, when $\overline{RD}$ changes from "H" to "L", $Q_{R3}$ and $Q_{R4}$ turn conductive and the node RI changes from "L" to "H", thereby causing $Q_{R2}$ to turn conductive. In consequence, the charge accumulated in the capacitor $C_R$ formed between the node $RA_1$ and the ground is gradually discharged in accordance with the current $I_{R1}$ flowing through $Q_{D13}$. As a result, the voltage $V_{RA1}$ at the node $RA_1$ changes from $[V_{CC}-V_{TP}]$ to a set value $V_{REF1}$ with a time constant, as shown in FIG. 3. The reason why the voltage waveform $V_{RA1}$ at the node $RA_1$ does not rapidly lower to "L" as compared to the voltage waveform $V_{SA}$ at the node SA, when the operation mode is changed from the stand-by mode to the reading mode, is that the capacitance which is produced on the digit line SD is much larger than the capacitance which is produced on the nodes RC and RD in the reference voltage producing circuit 200. Therefore, when $Q_{S2}$ turns conductive, the charge accumulated at the node SA rapidly moves to the digit line SD. On the other hand, in the reference voltage producing circuit 200, since the capacitance produced on the node $RA_1$ is larger than the capacitance produced on the nodes RC and RD, when the operation mode is changed from the stand-by mode to the reading mode, the time $td_1$ in which the voltage $V_{RA1}$ at the node $RA_1$ changes from $[V_{CC}-V_{TP}]$ to the set value $V_{REF1}$ is simply determined in accordance with capacitor $C_R$ formed between the node $RA_1$ and the ground, and the current $I_{R1}$ flowing through the reference IGFET $Q_{D13}$. The time $td_1$ is expressed in the equation (1).

$$td_1 = C_R \cdot \Delta V / I_{R1} \quad (1)$$

where $\Delta V = (V_{CC}-V_{TP})-V_{REF1}$. For example, if the device is designed, such that the current $I_{R1}$ of 10 μA flows through the reference IGFET $Q_{D13}$, the time $td_1$ of 200 ns is obtained, under the conditions that the current $I_M$ is 25 μA, the capacitance $C_R$ is 2PF, and the voltage difference $\Delta V$ is 1 V when the output voltage $V_{RA1}$ lowers from $[V_{CC}-V_{TP}]$ to $[V_{CC}-V_{TP}-V_{MIN}]$, the output $\overline{DO}$ of the differential amplifier 300 changes from "H" to "L". Thus, the content of a selected memory cell can be read out. Therefore, the minimum time after which the content of a selected memory cell can be read out practically depends on the lowering speed of the voltage $V_{RA1}$, and is expressed by $t_{DO1}$ in FIG. 3. The time $t_{\overline{DO1}}$ is considerably longer than the time $t_{\overline{SO}}$ needed for the output $V_{SA}$ of the sense amplifier circuit 100 to equilibrate with the set values of $V_{OFF}$ and $V_{ON}$. Consequently, the content of a selected memory cell is read out in accordance with the comparison in the differential amplifier 300 between the output voltage $V_{SA}$ of the sense amplifier circuit 100 and the output voltage $V_{RA1}$, which will be $V_{REF1}$ in the lapse of the time $t_{d1}$, of the reference voltage producing circuit 200. Then, an output of the differential amplifier 300 is supplied through the output buffer 400 to the output terminal 500.

Next, a semiconductor memory device in the first embodiment according to the invention will be explained in FIG. 4. The semiconductor memory device comprises memory cells $M_{M11} \ldots M_{Mn1}$ (only two bits of one column shown) arranged in a matrix pattern, NE-IGFETs $M_{S11} \ldots M_{Sn1}$ for selecting X addresses of the memory cells $M_{M11} \ldots M_{Mn1}$, NE-IGFETs $M_{T1} \ldots M_{Tn}$ for selecting X addresses of a byte, a sense amplifier circuit 100 for producing a signal of a level dependent on the content of a selected memory cell, a reference voltage producing circuit 200 for producing a reference signal, a differential amplifier 300 for comparing the memory cell signal and the reference voltage signal and amplifying a compared difference between the both signals, and a output buffer 400 for supplying an output of the differential amplifier 300 to an output terminal 500. As understood from the comparison between the circuit diagrams of FIGS. 1 and 4, wherein like parts are indicated by like reference numerals and symbols, arrangement and operation of the semiconductor memory device in the invention are common to those of the conventional semiconductor memory device except for those of the reference voltage producing circuit 200.

Figure 5:
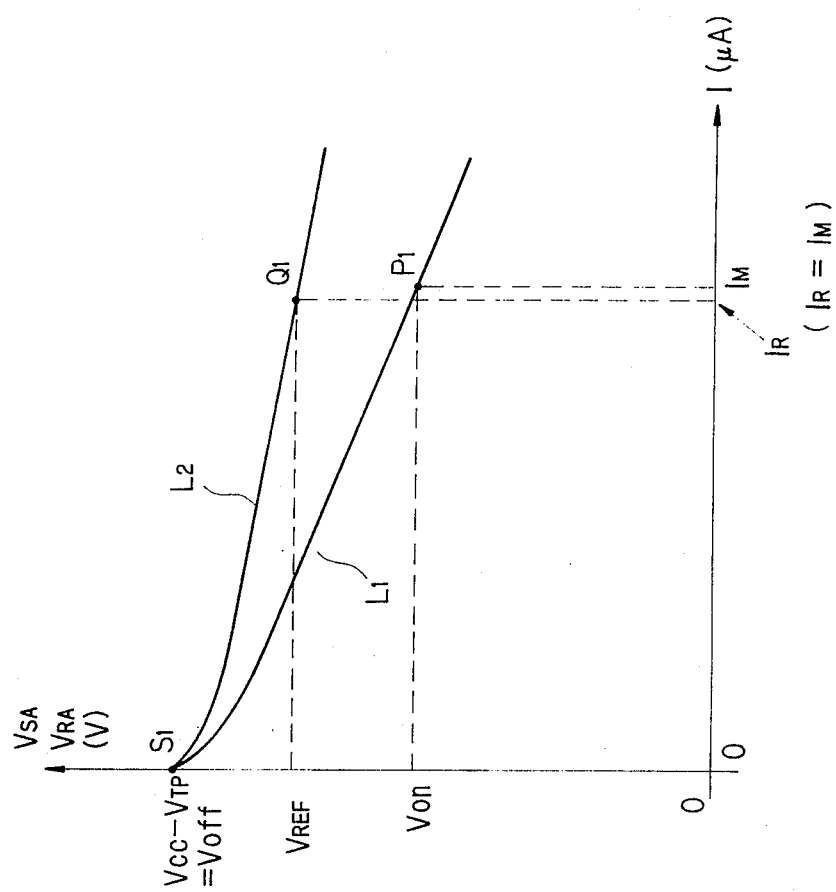
FIG. 5 is an explanatory diagram showing load characteristics of a sense amplifier circuit and a reference voltage producing circuit in the semiconductor memory device in the first embodiment

In the reference signal producing circuit 200, $Q_{R11}$, $Q_{R12}$ and $R_{R13}$ are PE-IGFETs having the same device dimension as that of $Q_{S1}$. $Q_{D3}$ is an N-channel depletion type IGFET through which a current $I_R$ of a low value flows in the reading mode. The voltage $V_{RA}$ of the output RA is determined by a load characteristic of a load circuit for $Q_{D3}$ and the value of the current $I_R$ flowing through $Q_{D3}$. The load circuit for $Q_{D3}$ comprises $Q_{R11}$, $Q_{R12}$ and $Q_{R13}$ which have the same device dimension as that of $Q_{S1}$ are connected in parallel to provide a characteristic modifying circuit 210. Therefore, the load characteristic of the reference voltage producing circuit 200 is different from that of the sense amplifier circuit 100. FIG. 5 shows the load characteristics $L_1$ and $L_2$ of the sense amplifier circuit 100 and the reference voltage producing circuit 200, wherein the current $I_R$ is approximately equal to the current $I_M$. More specifically, the current driving capacity of the characteristic modifying circuit 210 comprising $Q_{R11}$, $Q_{R12}$ and $Q_{R13}$ can be large than that of the corresponding IGFET $Q_{S1}$ in the sense amplifier circuit 100. Therefore, the value of the output voltage $V_{RA}$ can be set at the reference voltage $V_{REF}$ of a median between $V_{OFF}$ and $V_{ON}$, despite that the current $I_R$ is approximately equal to the current $I_M$. That is, the voltage $V_{RA}$ of the node RA reaches equilibrium at Q1 shown in FIG. 5, and therefore becomes equal to the reference voltage $V_{REF}$.

Figure 6:
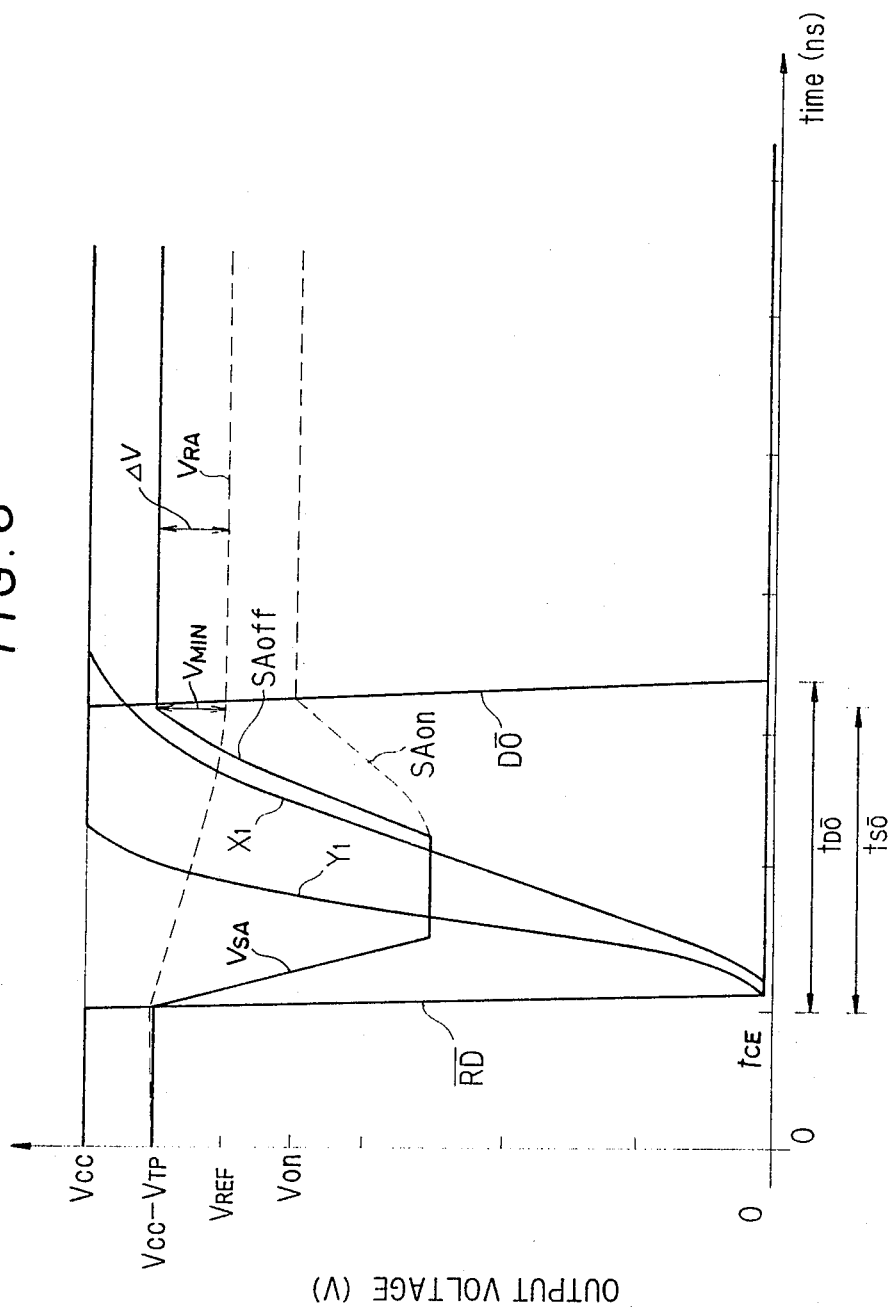
FIG. 6 is an explanatory diagram showing waveforms of signals in the semiconductor memory device in the first embodiment.

FIG. 6 shows waveforms of the output voltage $V_{SA}$ of the sense amplifier circuit 100, the output voltage $V_{RA}$ of the reference voltage producing circuit 200, the output signal $\overline{DO}$ of the differential amplifier 300, the control signal $\overline{RD}$ of the reading mode, and address signals $X_1$ and $Y_1$.

In operation, the voltage $V_{RA}$ of the output RA of the reference voltage producing circuits 200 is raised in accordance with the charge thereof to $[V_{CC}-V_{TP}]$ in the stand-by mode. When $\overline{RD}$ changes from "H" to "L" at the time of $t_{CE}$, $Q_{R3}$ and $Q_{R4}$ turn conductive and the node RI changes from "L" to "H", thereby causing $Q_{R2}$ to turn conductive. In consequence, the charge accumulated in the capacitor $C_R$ formed between the node RA and the ground is gradually discharged in accordance with the current $I_R$ flowing through $Q_{D3}$. As a result, the voltage $V_{RA}$ at the node RA changes from $[V_{CC}-V_{TP}]$ to the set value $V_{REF}$ with a time constant, as shown in FIG. 6. The time td in which the voltage $V_{RA}$ lowers down to the set value $V_{REF}$ is expressed in the equation (2).

$$t_d = C_R \cdot \Delta V / I_R \ldots \quad (2)$$

where $\Delta V = (V_{CC}-V_{TP}) - V_{REF}$

From the equation (2), the time $t_d$ of 80ns is obtained, where $Q_{D3}$ is designed to have a device dimension, such that the current $I_R$ is 25 μA which is equal to the current $I_M$ under the condition that the capacitance $C_R$ is 2PF, and the voltage difference $\Delta V$ is 1 V. Accordingly, the reading speed is much higher than that of the conventional semiconductor memory device. That is, the time $t_{D\bar{O}}$ which the voltage difference between the voltage $V_{OFF}$ and the voltage $V_{RA}$ becomes the minimum voltage $V_{MIN}$, thereby enabling the differential amplifier 300 to operate, is shortened. In the lapse of the time $t_{D\bar{O}}$, the output $D\bar{O}$ of the differential amplifier 300 changes from "H" to "L", so that the content of a selected memory cell can be read therefrom.

Figure 4:
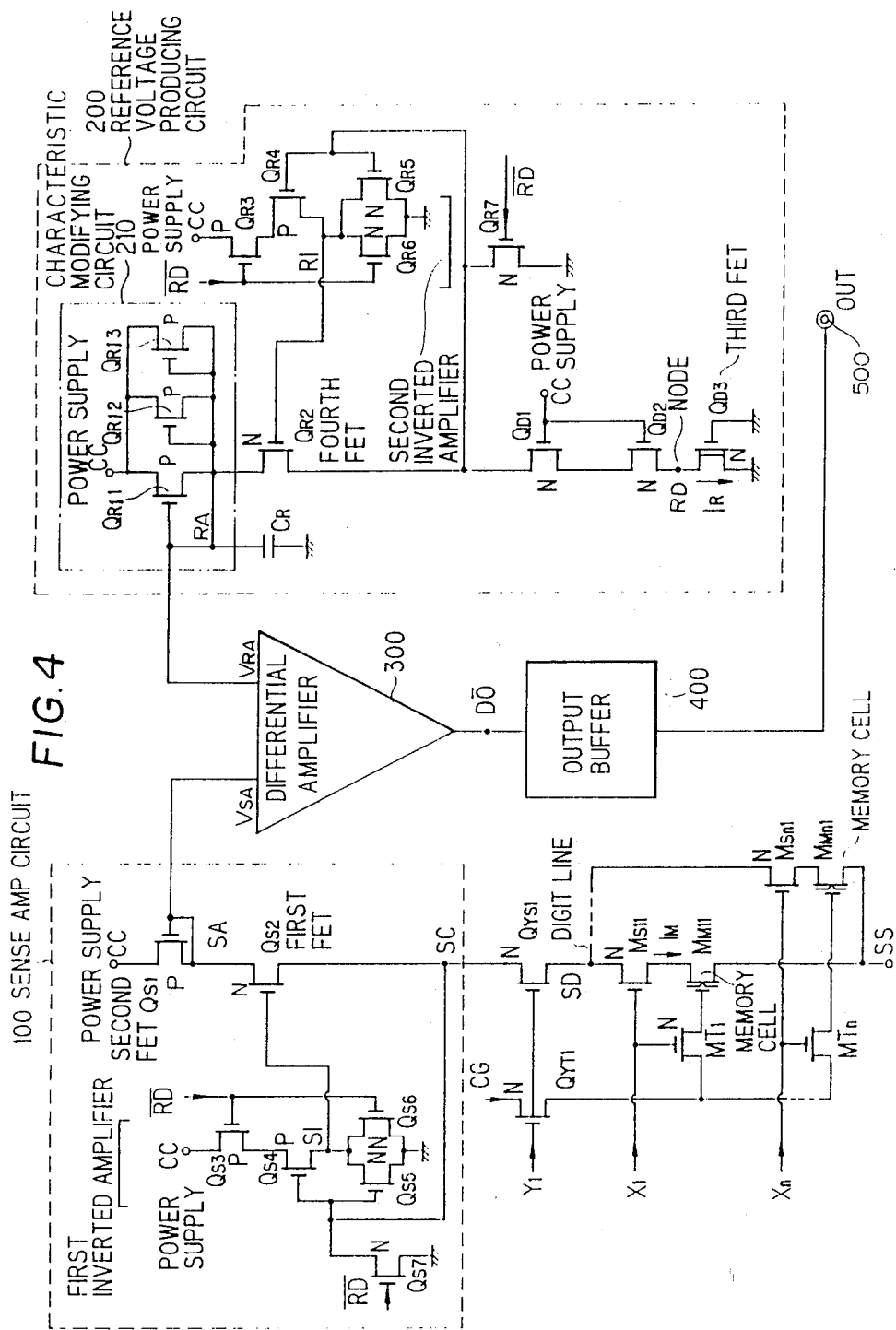
FIG. 4 is a circuit diagram showing a semiconductor memory device in a first embodiment according to the invention.
Figure 7:
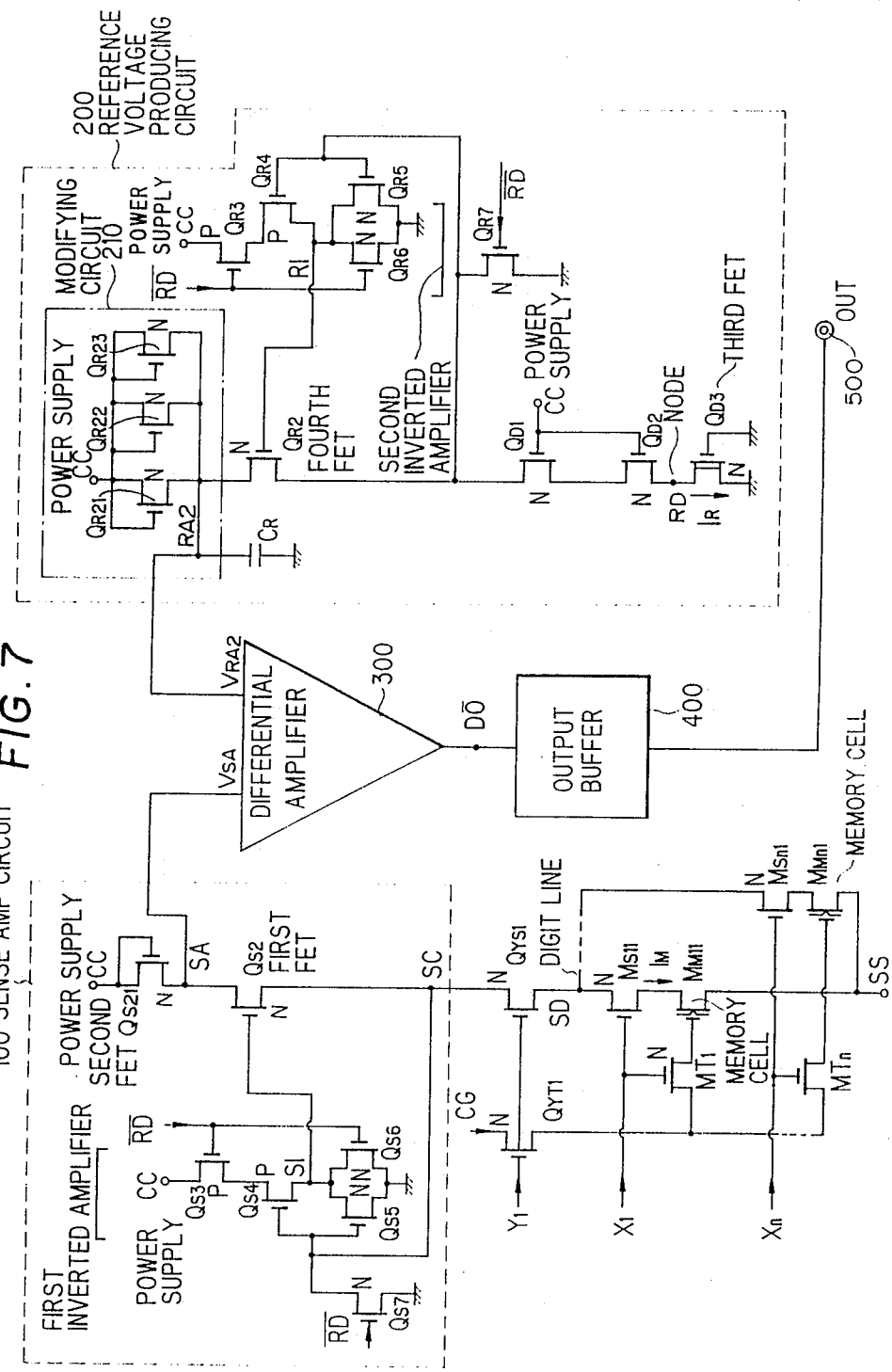
FIG. 7 is a circuit diagram showing a semiconductor memory device in a second embodiment according to the invention.

FIG. 7 shows a semiconductor memory device in the second embodiment according to the invention, wherein like parts are indicated by like reference numerals and symbols as explained in FIG. 4.

In the sense amplifier circuit 100 of the semiconductor memory device, $Q_{S21}$ is an NE-IGFET which is connected at the drain and gate thereof to a power supply CC. In the reference voltage producing circuit 200, $Q_{R21}$, $Q_{R22}$ and $Q_{R23}$ are NE-IGFETs having the same device dimension as that of $Q_{S21}$. The voltage $V_{RA2}$ of the output RA2 is determined by the load characteristic of a load circuit for $Q_{D3}$ and the value of the current $I_R$ flowing through $Q_{D3}$ The load circuit comprises $Q_{R21}$, $Q_{R22}$, $Q_{R23}$, $Q_{R2}$ to $Q_{R7}$, $Q_{D1}$ and $Q_{D2}$ IGFETs $Q_{R21}$, $Q_{R22}$ and $Q_{R23}$ having the same device dimension as that of $Q_{S21}$ are connected in parallel. Therefore, the load characteristic of the reference voltage producing circuit 200 is different from that of the sense amplifier circuit 100. Far this purpose, the device dimension of $Q_{S21}$, $Q_{R21}$, $Q_{R22}$ and $Q_{R23}$ is appropriately determined, such that a load characteristic of the sense amplifier circuit 100 and a load characteristic of the reference voltage producing circuit 200 are set as represented by the curves $L_1$ and $L_2$, respectively, of FIG. 5.

Accordingly, the value of the output voltage $V_{RA2}$ can be set at the reference voltage $V_{REF}$ which is a median between the voltages $V_{OFF}$ and $V_{ON}$ in a state that the current $I_R$ is approximately equal to the current $I_M$ in the same way as in the first embodiment. Therefore, the semiconductor memory device of the second embodiment provides the same advantage as described in the first embodiment. As a matter of course, the sense amplifier circuit 100 and the reference voltage producing circuit 200 operate in the same manner as in the first embodiment, provided that $[V_{CC}-V_{TP}]$ is replaced by $[V_{CC}-V_{TN}]$, wherein $V_{TP}$ is a threshold value of PE-IGFET, and $V_{TN}$ is that of NE-IGFET.

As described above, a semiconductor memory device according to the present invention is arranged, such that the reference voltage is set at a median between the output voltage $V_{ON}$ of the sense amplifier circuit 100, where a memory cell is stored with "0", and the output voltage $V_{OFF}$ of the sense amplifier circuit 100, where a memory cell is stored with "1", in the circuit structure that a load characteristic of a load circuit in the reference voltage producing circuit 200 is different from that of a load circuit in the sense amplifier circuit 100.

Therefore, a current value of a constant current source of the reference voltage producing circuit 200 can be set to be greater as compared to that of a conventional semiconductor memory device and to be substantially equal to a value of a current flowing through a selected memory cell which is stored with "0". Accordingly, the following advantages are resulted therefrom.

(1) When the operation mode is changed from the stand-by mode to the reading mode, the time in which the reference voltage equilibrates with a set value is shorter than in the conventional semiconductor memory device. Therefore, the invention is applied to a semiconductor memory device of a large capacity and a high speed.

(2) Even if noise is carried on a power supply or the ground due to current flowing through IGFETs during the switching thereof thereby deviating a reference voltage from a set value, charge and discharge for the reference voltage is carried out in the reference voltage producing circuit 200 faster than in that of the conventional semiconductor memory device, so that the reference voltage can be restored to the set value at a higher speed than in the conventional semiconductor memory device. Accordingly, a semiconductor memory device having a large noise margin can be provided.

Although a characteristic modifying circuit provided in a reference voltage producing circuit in the embodiments of the invention is a parallel circuit comprising three transistors of the same type as a second field effect transistor provided in a sense amplifier circuit, the number of field effect transistors used therein is not necessarily limited to three. The circuit may have a plurality of field effect transistors of a type a described above and connected in parallel.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. A semiconductor memory device comprising,
   a sense amplifier circuit for detecting a content of a memory cell selected from plural memory cells and producing a memory cell signal of high or low level dependent on said content,
   a reference voltage producing circuit for producing a reference voltage, and
   means for comparing said memory cell signal and said reference voltage to decide whether said content is "1" or "0",
   wherein said sense amplifier circuit includes means for setting a first predetermined voltage at a standby mode, and means for lowering said first predetermined voltage to a second predetermined voltage and then increasing said second predetermined voltage to said high or low level of said memory cell signal corresponding to said content of "1" or "0" in accordance with a first load characteristic thereof at a reading mode subsequent to said stand-by mode, and said reference voltage producing circuit includes means for setting a third predetermined voltage equal to said first predetermined voltage at said stand-by mode, and means for lowering said third predetermined voltage to said reference voltage in accordance with a second load characteristic which is different from said first load characteristic at said reading mode subsequent to said stand-by mode.

2. A semiconductor memory device according to claim 1, wherein said means for lowering of said reference voltage producing circuit provides a voltage drop equal to a median of a voltage difference between said high and low levels of said memory cell signal in accordance with said first and second load characteristics, and currents of the same level flowing through said means for lowering of said sense amplifier circuit and said reference voltage producing circuit.

3. A semiconductor memory device comprising, a sense amplifier circuit for detecting a content of a memory cell selected from plural memory cells and producing a memory cell signal of high or low level dependent on said content, said sense amplifier circuit including a first inverted amplifier having an input connected to a digit line of said memory cell, a first field effect transistor having a gate electrode connected to an output of said first inverted amplifier and a source electrode connected to said digit line, and a second field effect transistor positioned between a power supply and a drain electrode of said first field effect transistor and controlled to be constantly turned on in accordance with a gate potential, a reference voltage producing circuit for producing a reference voltage, said reference voltage producing circuit including a third field effect transistor having a drain electrode connected to a predetermined node therein and a source electrode connected to ground and turned on at a reading mode, a second inverted amplifier having an input connected to said predetermined node and having the same input and output characteristics as those of said first inverted amplifier, a fourth field effect transistor having a gate electrode connected to an output of said second inverted amplifier, a source electrode connected to said predetermined node and having the same device dimension as that of said first field effect transistor, and a characteristic modifying circuit composed of plural field effect transistors connected in parallel and positioned between a power supply and a drain electrode of said fourth field effect transistor, each of said plural field effect transistors having the same device dimension as that of said second field effect transistor, and means for comparing said memory cell signal and said reference voltage to decide whether said content is "1" or "0".

* * * * *

UNITED STATES PATENT AND TRADEMARK OFFICE
CERTIFICATE OF CORRECTION

PATENT NO. : 4,974,207

DATED : November 27, 1990

INVENTOR(S) : Kiyokazu HASHIMOTO

It is certified that error appears in the above-identified patent and that said Letters Patent is hereby corrected as shown below:

Col. 1, line 37, delete "latter" and insert --later--;

Col. 3, line 46, delete "QR$_5$" and insert --Q$_{R4}$--;

Col. 5, line 15, after "and" insert --the voltage V$_{SA}$ at the node SA rises again and reaches--;

Signed and Sealed this

Twenty-fourth Day of November, 1992

Attest:

DOUGLAS B. COMER

*Attesting Officer*  *Acting Commissioner of Patents and Trademarks*